United States Patent [19]
Eichelberger et al.

[11] 3,986,057
[45] Oct. 12, 1976

[54] HIGH PERFORMANCE LATCH CIRCUIT

[75] Inventors: Edward Baxter Eichelberger, Purdy Station; Gordon Jay Robbins, Wappingers Falls, both of N.Y.

[73] Assignee: International Business Machines Corporation, Armonk, N.Y.

[22] Filed: June 30, 1975

[21] Appl. No.: 592,153

[52] U.S. Cl. ............................ 307/289; 307/208; 307/213; 307/215; 307/217; 307/299 A; 307/317 A
[51] Int. Cl.² ................. H03K 3/286; H03K 19/08; H03K 19/34; H03K 19/38
[58] Field of Search .......... 307/208, 214, 215, 289, 307/291, 269, 299 A, 317 A, DIG. 1, 213, 217

[56] References Cited
UNITED STATES PATENTS
| | | | |
|---|---|---|---|
| 3,283,170 | 11/1966 | Buie | 307/299 A |
| 3,783,254 | 1/1974 | Eichelberger | 307/203 X |

OTHER PUBLICATIONS
Solid State Products, Inc., Bulletin, D420-02-12-59, Dec. 1959, pp. 22-24.

Bodendorf et al., "Hazard-Free and Nonsaturating Polarity-Latch," IBM Tech. Discl. Bull., vol. 14, No. 7, p. 2046, Dec. 1971.
Palmieri, "DC Trigger Circuit," IBM Tech. Discl. Bull., vol. 13, No. 5, p. 1075, Oct. 1970.

*Primary Examiner*—John S. Heyman
*Assistant Examiner*—Larry N. Anagnos
*Attorney, Agent, or Firm*—Theodore E. Galanthay

[57] ABSTRACT

Disclosed is a high performance logically hazard-free latch circuit compatible with TTL technology. The occurrence of both a clock and data signal provides an inverted data output signal at the output node which is fed back to the base electrode of a multi-emitter transistor. The output node then remains latched at the desired logic level until the occurrence of a subsequent clock signal. Also disclosed are techniques for improving the capabilities of the latch and for accepting additional clock and data inputs. The polarity-hold latch circuit disclosed herein is advantageously implemented in semiconductor integrated circuit technology.

13 Claims, 6 Drawing Figures

3,986,057

HIGH PERFORMANCE LATCH CIRCUIT

BACKGROUND OF THE INVENTION

1. Field of the Invention

This invention relates to a latch circuit and more particularly to a high performance latching circuit that is logically hazard-free and advantageously implemented in semiconductor integrated circuit technology.

2. Description of the Prior Art

Clocked latching circuits are well known in the art as bistable circuits having both clock signal and data signal inputs wherein the output is not altered from its bistable state until the occurrence of a clock signal at the input. Latch circuits utilizing a combination of logic elements such as "OR" and "AND" logic circuitry are well known. Generally, this class of circuits includes a feedback path from the output, to thereby latch the output node to its desired logic state.

It is desirable to improve the performance of latch circuits with respect to switching time, signal response, number of circuit elements required, reliability of operation, and versatility in terms of data and clock signal inputs, thereby to increase the flexibility, versatility, and capability of data processing systems. Another advantageous property of latching circuits is to avoid race conditions and "glitches" by providing circuits that are logically hazard free.

Moreover, a circuit should be readily integratable in monolithic semiconductor circuit technology. To this end, it is desired to utilize minimum semiconductor space to perform a latching function and to dissipate minimum power. A latch circuit should also be compatible with the circuit family technology used for related circuits.

SUMMARY OF THE INVENTION

Accordingly, it is an object of this invention to provide an improved latching circuit having improved signal response characteristics.

Another object of this invention is to provide an improved latch circuit operable, if desired, with only a single clock signal.

Another object of the invention is to provide an improved latch circuit compatible with TTL circuit family technology signal input and output potential levels.

Still another object of this invention is to provide an improved latch circuit having fewer active elements and being thereby integratable in semiconductor circuit technology with a minimum of space requirements.

A still further object of this invention is to provide a latch circuit with less output skew between latch set and reset transition times.

Lastly, it is an object of this invention to reduce power dissipation over conventional latch circuits.

In accordance with the foregoing objects of the present invention, in one embodiment, first and second transistors receive the input of a clock and data signal respectively. The clock and data signals are also applied to a multi-emitter transistor. The output of the first transistor is applied to the second transistor and the output of the second transistor and the multi-emitter transistor are applied to a common node connected to the input of an output transistor. The output of the output transistor is connected to an output node, forming the output of the latch, and electrically connected to the multi-emitter transistor. Upon the occurrence of both data and clock signals, the output node provides an output signal that is a logically inverted data signal. The polarity of the output node is then maintained at the same logic level until a subsequent occurrence of a clock signal.

In alternate embodiments, provision is made for increasing the flexibility and performance of the latch by providing additional devices to accept and process a plurality of clock and data inputs.

The foregoing and other objects, features, and advantages of the invention will be apparent from the following and more particular description of the embodiments of the invention as illustrated in the accompanying drawings.

DETAILED DESCRIPTION

It will be noted by referring to the various drawings that essentially the same inventive concept in the same basic circuit is disclosed.

Figure 1:
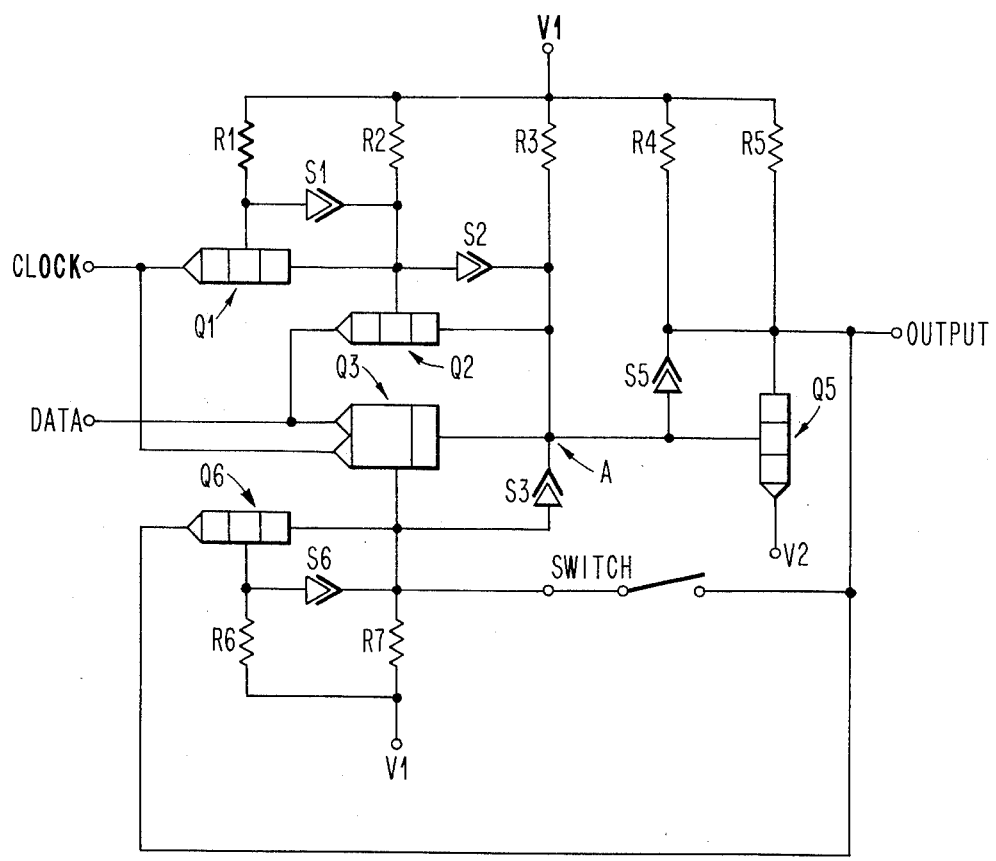
FIG. 1 is a schematic circuit diagram of an embodiment of the invention.

Refer now to FIG. 1 for a circuit diagram of the latch circuit of the present invention in its basic form. A first potential V1 is applied to a plurality of load resistors R1, R2, R3, R4, R5, R6, and R7. A second fixed potential V2 is applied to the emitter electrode of output transistor Q5. For the transistor-transistor logic (TTL) compatibility provided by the latch circuit herein, V1 is more positive than V2 by approximately 1.5 volts. Each of the load resistors has resistance of approximately 7.5k-ohms. If it is desired to ground the potential V1, then V2 will be at approximately −1.5 volts.

The clock input is applied to the emitter electrode of first transistor Q1 and to one of the emitters of multi-emitter transistor Q3. The data is applied to another emitter of multi-emitter transistor Q3 and also to the emitter of second transistor Q2. The output of first transistor Q1 at its collector electrode is applied to the base electrode of second transistor Q2. Second transistor Q2 and a portion of multi-emitter transistor Q3 are connected in electrical parallel between first node A and the data input as the collector of Q2 and the collector of Q3 are both electrically connected to node A. The electrical signal level on node A is inputted to the base of output transistor Q5 which provides, at its collector, an output to the output node which will be an inverted data signal. The output from the output node is connected to the base electrode of multi-emitter transistor Q3 through a feedback path. The feedback path in its simplest form is a direct electrical connection with the illustrated switch in its closed position. It is of course understood that the switch is a mere schematic representation for ease of explaining the alternative between the two possible feedback paths illustrated in FIG. 1. In the second alternative, (the switch being in an open position), the feedback path is completed through the transistor Q6 as shown.

The resistors R1 through R7 provide the various load and biasing functions in their usual manner. R1 biases the base of Q1 while R2 biases the base of Q2 and is also connected to the collector of Q1. R3 is connected to the collector of Q2 and Q3. R4 and R5 are connected in parallel with each other to provide a lowered load impedance to the collector of Q5. R6 is connected between the first potential V1 and the base of Q6 while R7 is connected between the potential V1 at one end and the base of Q3 and collector Q6 at the other end.

The Schottky diodes S1, S2, S3, S5, and S6, are each connected between the base and collector electrodes of their respective transistors and prevent each of their associated transistors from going into saturation, and also prevent the transistor from turning "on" in the reverse direction due to reverse biasing. The performance of this circuit and the space that the components occupy in integrated form are critical trade-offs in the present invention. Thus, it has been found that Schottky diode S2 associated with transistor Q2 might be deleted permitting the layout of the FIG. 1 circuit with the switch in the open position in only two internal cells. (The layout of the herein circuit as well as the meaning of "cell" will be described in greater detail in the discussion of FIG. 6). The deletion of Schottky diode S2, however, might decrease the performance of the latch circuit on one of the two transitions. To further reduce the space occupied by the herein latch circuit, transistor Q6 together with Schottky diodes S2 and S6 and resistors R6 and R7 might also be deleted with the schematically illustrated switch in the closed position describing a short circuit connection from the output node to the base of Q3. This saving in component space results in a latch circuit with a reduced drive capability because the output node is clamped.

Figure 3:
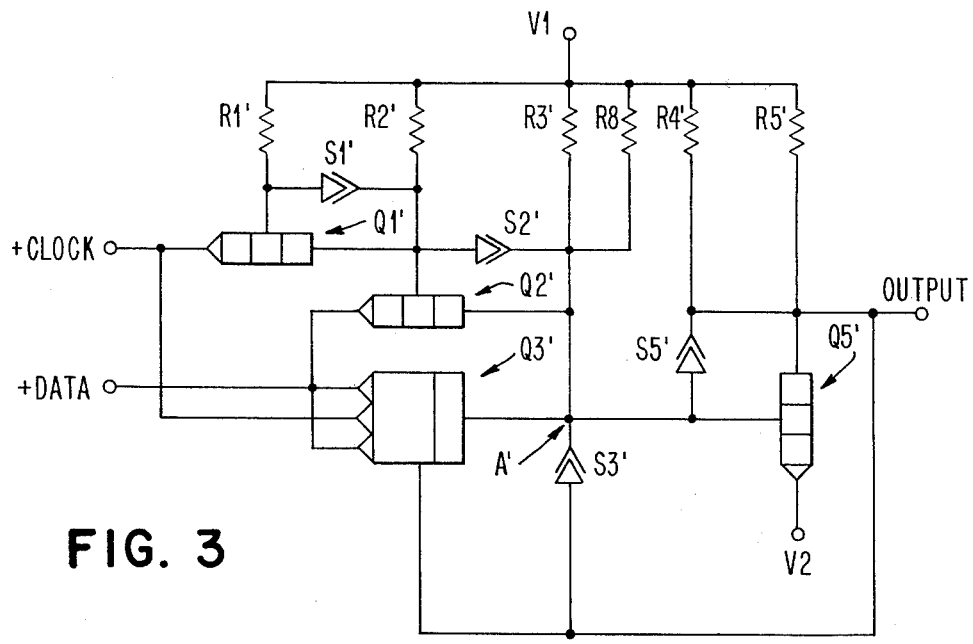
FIG. 3 is a schematic circuit diagram of an embodiment of the invention requiring fewer devices.

With continued reference to FIG. 1, refer also to FIG. 3 in which corresponding elements have been numbered with corresponding reference numerals (indicated with a prime) insofar as practical. FIG. 3 illustrates a portion of the just described modifications in which Schottky diode S6, resistors R6 and R7, and transistor Q6 have been deleted. Note also that R8 has been added in electrical parallel with R3'. Also, multi-emitter transistor Q3' has been illustrated with three emitters instead of just two with two of the three emitters connected together. FIG. 3 illustrates the circuit of the present invention with a lesser number of components corresponding to a lower performance level and lesser flexibility in terms of additional data and clock signal inputs.

Figure 4:
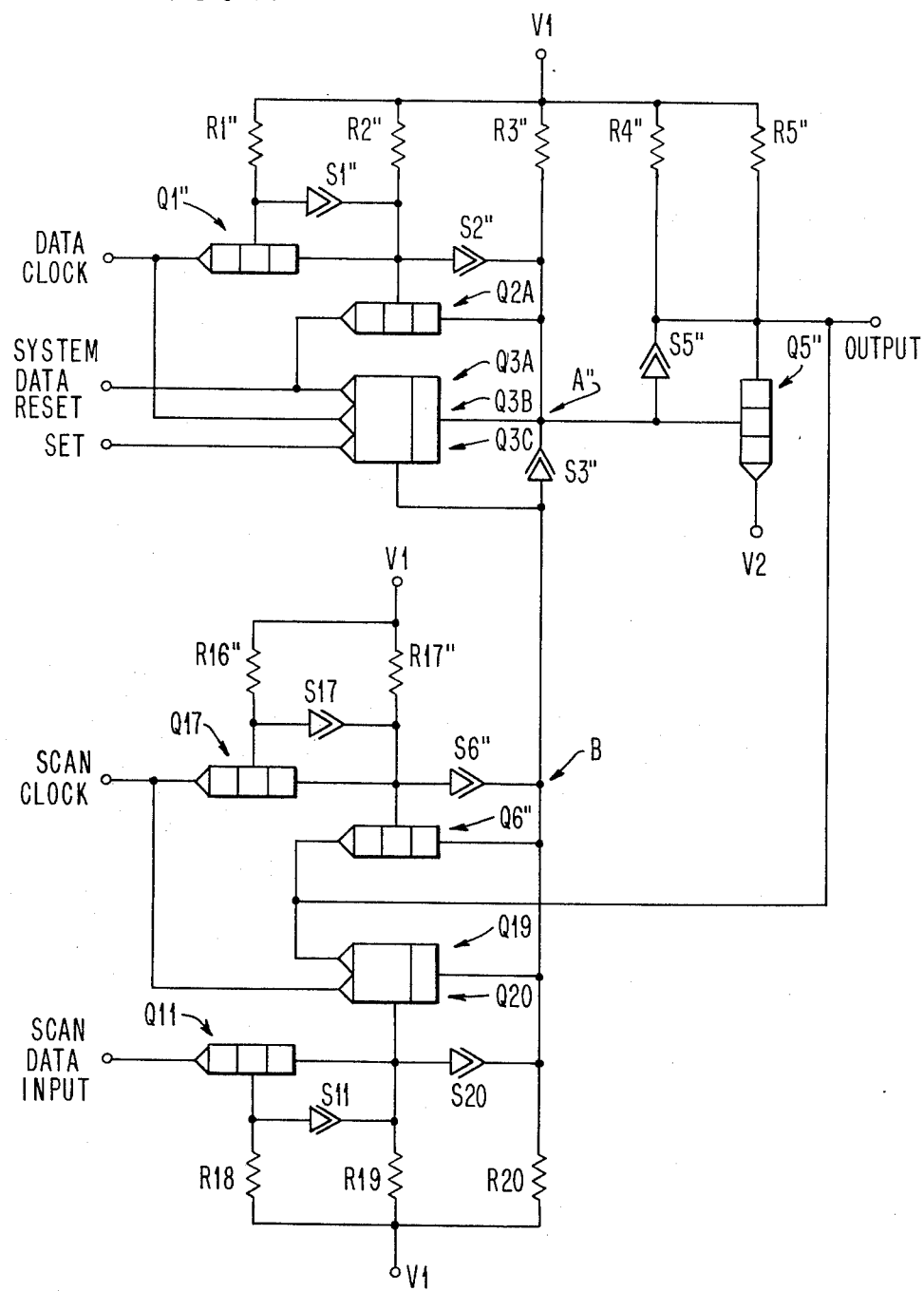
FIG. 4 is a schematic circuit diagram of an embodiment of the invention providing additional flexibility.

Refer now to FIG. 4 which shows a latch circuit in accordance with the present invention with added flexibility achieved by the use of additional components. Corresponding elements have again been numbered with corresponding reference numerals insofar as practical, but with a double prime notation. With respect to the previously noted multi-emitter transistor, it is now designated as transistors Q3A, Q3B, and Q3C. With this designation it is easier to identify Q3A as the transistor receiving the system data or reset input, transistor Q3B receiving the data clock input, and transistor Q3C receiving a set input if desired.

In addition to the inputs previously described, the circuit of FIG. 4 also has the capability of accepting a scan clock input at the emitters of Q17 and Q20. There is also the capability of accepting a scan data input at the emitter of Q11. The first potential V1 is also applied to each of resistors R16, R17, R18, R19, and R20. The collector of Q17 is connected to the base of Q6'' which has its collector connected to the common connection leading to the base of Q3A-Q3B-Q3C. The collector of transistor Q19-Q20 is also connected to the same common connection designated by conductor B. The emitter of Q6'' is connected in common with the emitter of Q19 receiving an input from the output node. The base of Q11 is connected to R18. The resistor R19 is connected to the base of Q19-Q20 and forms a load to the collector of Q11. R20 forms a load for the collector of Q19-Q20 as well as the collector of Q6''. R16 is connected to the base of Q17. R17 is connected to the base of Q6'' and forms the load to the collector of transistor Q17.

Figure 5:
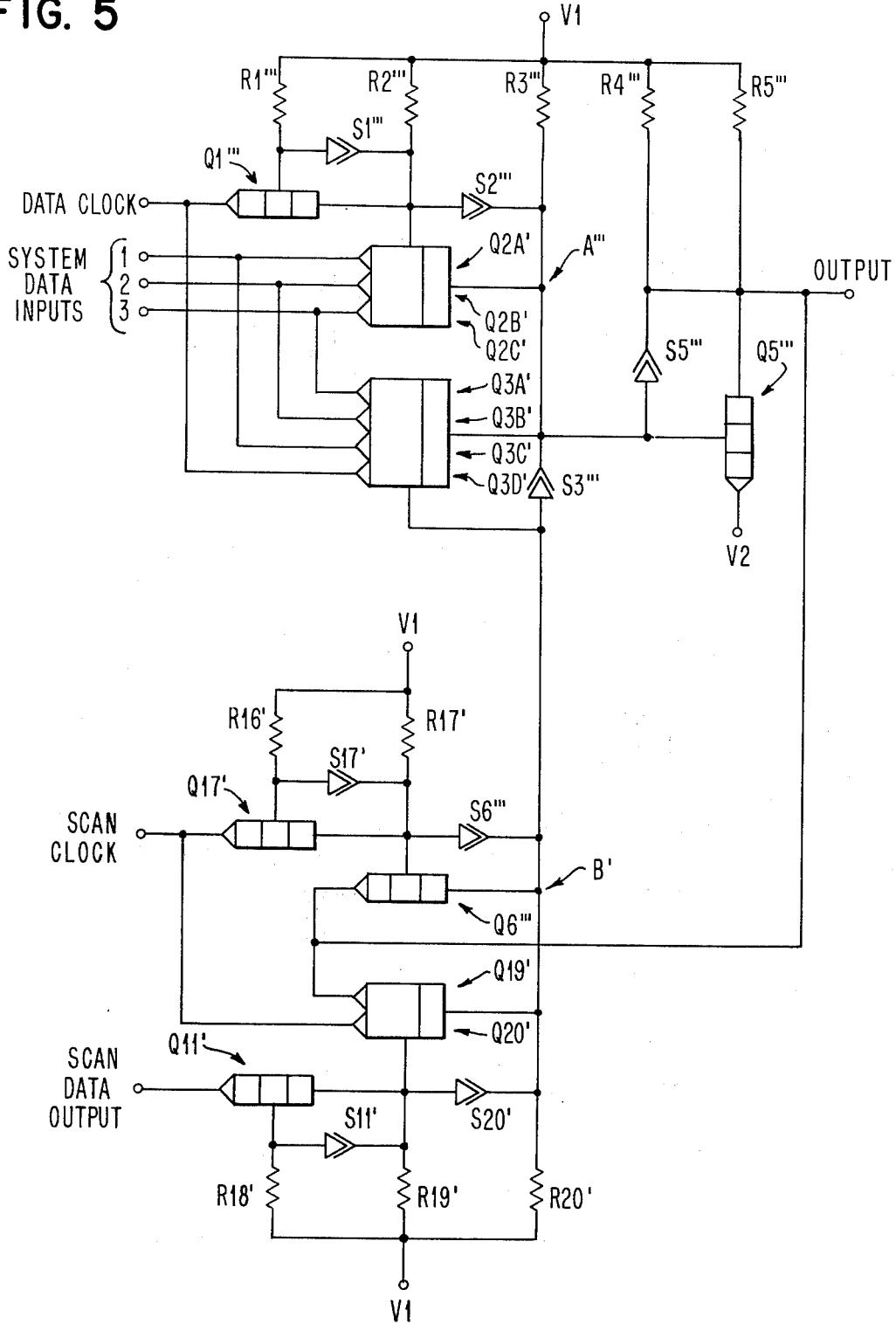
FIG. 5 is a schematic circuit diagram of another embodiment of the present invention providing additional performance and flexibility.

Refer now to FIG. 5 for a circuit diagram of the present invention with the further flexibility of accepting a plurality, e.g. three system data inputs. Corresponding elements have again been labeled with corresponding reference numerals insofar as practical. Those elements designated by a triple prime are also found in the circuit diagrams of FIGS. 1, 3, and 4. Those elements described with a single prime were previously noted only in FIG. 4.

It will be noted that the change from previous circuit diagrams is found in multi-emitter transistors Q2A'-2B'-2C' and Q3A'-3B'-3C'-3D'. In previously described FIG. 4 transistor Q2A only has a single emitter while transistor Q3A-3B-3C only had three emitters. The addition of two emitters to transistor Q2A and the addition of one more emitter to transistor Q3A-3B-3C (FIG. 4) and the replacing of a set input by a system data input provides three separate inputs to the latch of the present invention. The illustrated connection of the two multi-emitter transistors to the three system data inputs provides a positive logical AND circuit so that all data inputs must be at an up level during the occurrence of the data clock input in order to bring node A' to an up level turning output transistor Q5''' on, bringing the output node to a logical down level.

Figure 6:
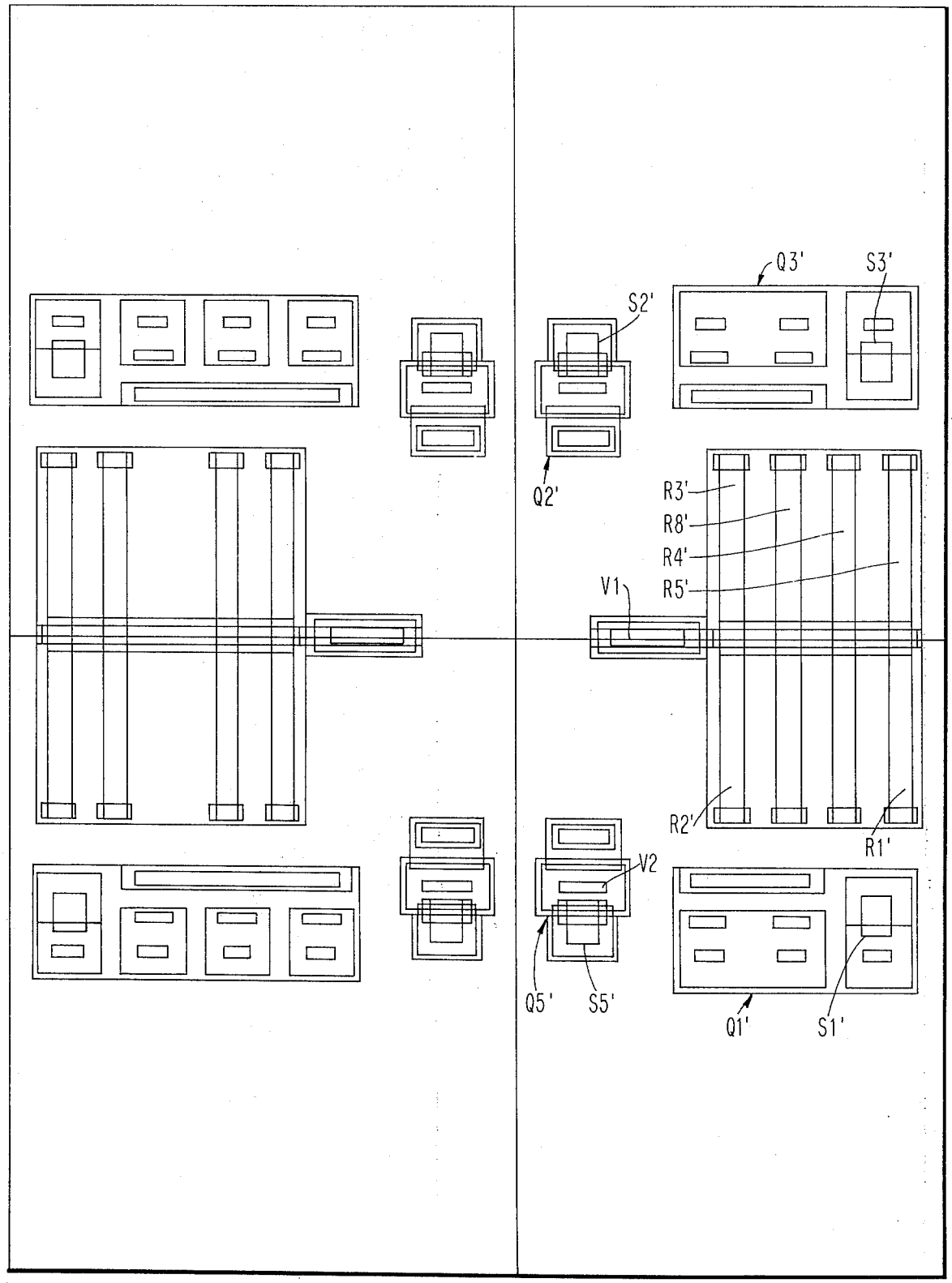
FIG. 6 is a schematic top view of a semiconductor surface illustrating the placement of various circuit devices.

Refer now to FIG. 6 for an illustrative example how the circuit of the present invention might be implemented in integrated semiconductor technology. In one type of large scale integrated semiconductor technology, a master slice having a fixed pattern of unconnected components is fabricated. A group of components can be referred to as a cell while a group of cells can be referred to as a macro unit. A large number of such macro units are then formed in a semiconductor wafer prior to the application of metallic conductor personalization. Such an arrangement of semiconductor components is illustrated in FIG. 6 showing four cells, i.e. one-half of an eight cell macro unit. For greater detail and additional background information with respect to such a wireable planar integrated circuit chip structure, refer to co-pending patent application Ser. No. 483,463, filed June 26, 1974, inventor E. E. Cass.

With continued reference to FIG. 6, two of the cells have been labeled with reference numerals corresponding to the components in the circuit diagram of FIG. 3. Eight resistors are positioned back to back, in the two adjoining illustrated cells, connected to the common buss which is connected to the V1 potential terminal. As was previously mentioned, V1 may typically be ground potential. Also note transistor Q1' with its associated Schottky diode S1'. Q1' would have the capability of being a multi-emitter transistor if desired. For example, multi-emitter transistor Q3' with its associated Schottky diode S3' has the same diffusion topology, and is connected as a multi-emitter transistor. Further note transistor Q2' and transistor Q5' with their associated Schottky diodes S2' and S5' respectively. The emitter electrode of transistor Q5' is connected to V2 which is a potential more negative than V1. The actual metallic conductors interconnecting the various components have been omitted for purposes of simplifying the illustration. The sole purpose of briefly describing a typical layout is to illustrate the fact that the circuit of FIG. 3 can be integrated within only two cells as shown. The circuit of FIG. 3 thus implemented is implemented in TTL circuit technology which is therefore compatible with other TTL circuits on the chip. The circuit arrangement described utilizes less space than would be required if the equivalent latching function were to be implemented with logic blocks such as AND and/or OR logic circuits.

OPERATION

Figure 2:
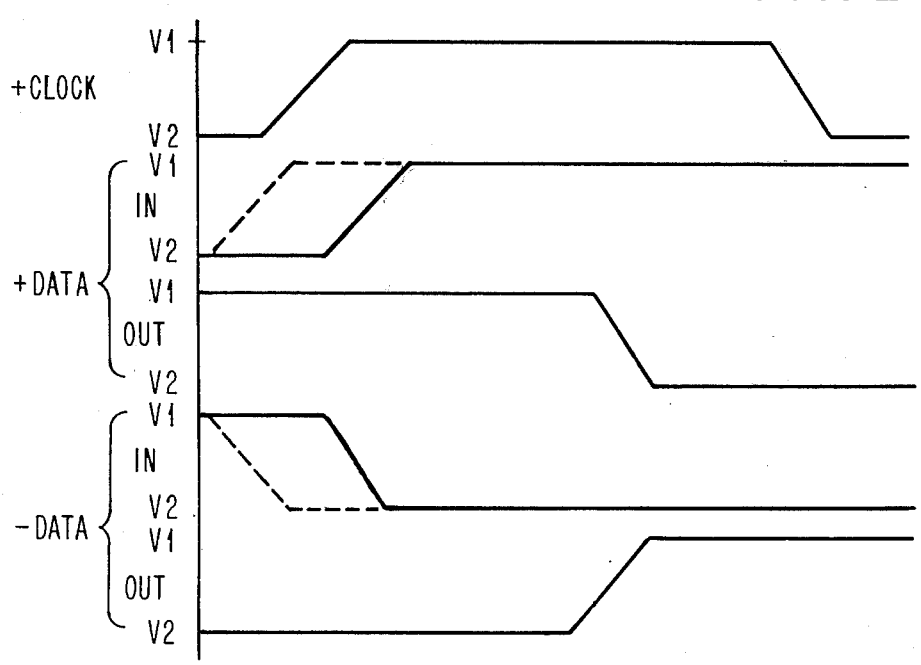
FIG. 2 is a series of waveform diagrams illustrating the operation of the present invention.

Refer initially to FIGS. 1 and 2 for a description of the operation of the present invention. As previously mentioned, assume V1 as the higher potential level at ground while V2 is at approximately −1.5 volts. The logic signal up and down levels at the inputs and outputs of the latch will be within these fixed limits by a few tenths of a volt, as is well known for TTL circuits of this type. Also, in discussing the operation of FIG. 1, assume the illustrated switch first in the open position.

In order to input the data into the present latch, symmetrical input transistors Q2 and Q3 are provided. The clock signal is received at Q1 and the other emitter of Q3. These signals are illustrated in FIG. 2 by the top two waveforms. Assume first the illustrated timing condition in which the clock signal is present before the desired data. Also assume that the latch is initially in its reset condition so that the output node is at an up level as illustrated by the third waveform in FIG. 2. As the clock signal is brought to an up level, Q1 is turned off permitting the base of Q2 to rise to an up level tending to turn Q2 on. As the data also rises, however, Q2 is cut off and since the emitters of Q3 and Q2 are also brought to an up level, node A rises to an up level due to current entering the node through R3. An up level at node A turns output transistor Q5 on, causing its collector and the output to drop to a logic down level. This turns on Q6 bringing the base electrode of Q3 to a down level maintaining Q3 off. At this point, Q3 is desensitized to any input change at its emitters. As the clock signal falls to its down level, Q1 is turned on bringing the base of Q2 to a down level, maintaining Q2 off. This desensitizes transistor Q2 to any changes in potential at its emitter. Thus, the latch is fully set and insensitive to data signal changes without the occurrence of a clock signal.

At this point, the latch is in its "set" condition. If the clock is again brought to an up level and then the data is brought from an up level to a down level, then node A is pulled down to approximately −1.0 volts as the emitter of Q2 follows the falling data signal. With node A brought to a down level, Q5 is cut off causing the output to rise to its up level. The up level output signal turns transistor Q6 off causing the base of Q3 to be brought to an up level by current through R7. As the clock input is brought to a down level, Q3 continues to conduct maintaining node A at its logic down level. With the clock signal at its down level, Q1 is also turned on keeping Q2 cut off. Thus the data signal applied to the indicated emitter of Q3 and Q2 does not effect the conduction level of either of these transistors so long as the clock signal pulse is maintained in its down level. Thus, the latch remains in its "reset" state.

It should here be pointed out that the latch will also operate satisfactorily if the data input pulse should occur before the clock pulse, as illustrated by dotted lines in the second and fourth waveform of FIG. 2. Assume that the latch is initially in its reset state with the output in a logical up state. If an up level is presented on the data line first, the latch will not respond to this up level signal. However, as the clock is brought to an up level, all the emitters of transistors Q1, Q2, and Q3 follow it to an up level causing node A to also be brought to an up level by current through R3. As node A rises, Q5 is turned on bringing the output to a down level. This turns Q6 on, turning Q3 off. As the clock returns to its down level, Q2 is also turned off desensitizing the latch to changes in the data input signal.

Assuming next that the latch was initially in its set condition with the output at a logical down level, the occurrence of a down level data signal prior to the occurrence of a clock signal will not alter the state of the latch. However, when the clock is turned on Q1 turns off causing Q2 to turn on which causes node A to be pulled down. This in turn, cuts off Q5 resulting in the output rising to an up level. Q6 is then cut off turning on Q3. If the clock is then dropped to a down logic level, Q2 is cut off by Q1 and Q3 is kept on by the falling clock, maintaining the latch in its reset state.

The foregoing description is also pertinent to the operation of FIG. 3. An electrically different result with the circuit of FIG. 3 is that the output becomes clamped. The clamping action occurs when the output node is to be maintained in a logic up level. This maintains transistor Q3' on to maintain node A' at an up level. During the retention time of the latch, the clock signal input to the emitter of Q3' (as well as possibly the data input) are maintained at a down level so that its base emitter junction is forward biased. This tends to bring the base of Q3' one diode voltage drop above the down level. The output node, however, to which the base of Q3' is connected should be maintained at its up level by current passing through R4' and R5' while Q5' is held cut off. This clamping action results in lowering of the up level at the output node.

A further modification in FIG. 3 from the FIG. 1 circuit is the utilization of additional resistor R8 in electrical parallel with R3'. It is the purpose of R8 to decrease the upgoing transition time of node A', thereby speeding up the operation of the latch. It is noted that certain nodal capacitance at node A' as well as the collector-isolation capacitance of Q2' and Q3' and, most importantly, the base-collector capacitance of Q3' which results in an effective "miller" capacitance across the base-collector of Q5 tend to charge twice as quickly when the resistive path has its value of resistance cut in half. A further distinction first noted in FIG. 3 is that multi-emitter transistor Q3' has three emitter electrodes with two of them shorted together. This does not functionally affect the operation of the circuit but is a process modification that can improve the testability of the circuit in integrated form.

In the FIG. 4 circuit, multi-emitter transistor Q3A-Q3B-Q3C has its third emitter connected to a separate set input while the system data input may also act as a separate reset input. This provides the flexibility of having not only a polarity hold latch but also a set/reset latch. The operation of the latch of FIG. 4 as a polarity hold latch is quite similar to that previously described for FIGS. 1 and 3. As a set/reset latch, the resetting of the latch will first be described. If the system data input node is brought to a logical down level and the data clock signal is brought to a logical up level then Q1″ cuts off allowing Q2A to turn on bringing node A to a down level of approximately minus 1.0 volts which cuts off Q5″ permitting the output node to rise to an up level. This causes Q6″ and Q19 to become cut off which enables transistors Q3A-Q3B-Q3C to respond to their emitters turning the multi-emitter transistor on. If the data clock is now allowed to drop, Q2A cuts off due to Q1″ turning on, thereby maintaining the latch in its reset state. During the reset transition of the latch, the set input node can be left at any level since the latch is reset dominant.

At this point in time, the latch is reset and it is desired to set the latch. If the set node is brought to a logical up level and the data clock signal is then brought to an up level, (the system data (−reset) node also being at an up level or floating), then the multi-emitter transistor and transistor Q1″ (which in turn cuts off transistor Q2A) are cut off bringing node A″ to an up level, bringing the output node to a down level bringing the base electrode of the multi-emitter transistor to a down level making the latch unresponsive to data input changes applied after the data clock node inputted to the emitter of Q1″ is maintained at a down level. This is obvious since as long as Q1″ is maintained on, the base of Q2A is maintained at a down level keeping Q2A cut off. As long as this condition persists, node A″ will be maintained at an up level.

FIG. 4 has the additional capability of receiving inputs referred to as "scan clock" and "scan data input". This additional capability is particularly advantageous in circuit design of the type described in Eichelberger U.S. Pat. Nos. 3,748,907, 3,783,254, and 3,761,695. In the operation of the circuit of FIG. 4, it should be pointed out that the occurrence of the data clock and the scan clock are mutually exclusive. Thus, during the entire foregoing description of the FIG. 4 circuit, the node receiving the scan clock input was maintained at an up level keeping Q17 and Q20 cut off. Thus the occurrence of signals on the scan data input node could not affect the potential at the output node. If it is desired to determine the logic level at the output of the latch in terms of logic level at the node receiving the scan data input, then it is necessary to maintain the data clock node at its down level. A down level signal on the data clock node will keep Q2A cut off while the conductive state of multi-emitter Q3A-Q3B-Q3C will be determined by the condition on conductive line B. Assume first the condition that the latch is reset, the data clock is at a down level and the output of the latch is therefore at an up level. If the scan data input is brought to an up level, and the scan clock input is brought to a down level, then Q20 and Q17 will be turned on. Q17 turning on cuts Q6″ off preventing it from affecting the potential on conductive line B. Q20 being on, however, brings conductive line B to a down level of approximately −1.0 volt which turns off multi-emitter transistor Q3A-Q3B-Q3C, thereby allowing node A″ to rise and turn on Q5″ which, in turn, causes the latch output to drop to a further down level of approximately −1.2 volts. This turns on transistor Q19. If the scan clock is now turned to a logical up level, Q17 ceases to conduct causing Q6″ to turn on and hold the latch in its set state.

With the latch set and the data clock remaining at a down level, the latch output remains at a logical down level. If the scan data input is brought to a logical down level turning on Q11 which holds off Q19 and Q20, and then the scan clock is brought to a logical down level, Q17 conducts which causes Q6″ to be cut off which causes conductive line B to rise and turn on Q3B which, in turn, pulls node A″ down causing Q5″ to be cut off and allowing the latch output node to rise to a logical up level. Since the emitters of Q6″ and Q19 are now at their up level, when the scan clock is returned to a logical up level and Q17 turns off, the latch is maintained in its reset state. FIG. 5, similar to FIG. 4, maintains the scan capabilities the advantages of which are described in the aforementioned Eichelberger patents. FIG. 5 additionally adds the flexibility of three separate data inputs in a logical AND-INVERT (AI) configuration. Thus if all three system data inputs are maintained at an up level when the data clock is at an up level, then the output node will be brought to a down level. However, if any of the three data inputs are at a logical down level when the data clock is at an up level, then the output node will be brought to an up level. Once the latch has been set or reset into one of its two binary states, and the data clock is brought to a down level, the latch becomes insensitive to all system data inputs.

What has then been described is a high performance latch that is readily implemented in an integrated semiconductor circuit technology and compatible with the TTL circuit family. Less of the semiconductor surface is required to implement the latching function then would be required if AND, OR, INVERT, logic type blocks were used to achieve the function. The present latch is also compatible with the logic design techniques described in the above named Eichelberger patents and also provides the capability of combining a logic function with the latching function as illustrated, for example, in FIG. 5.

While the invention has been shown and described with reference to specific embodiments thereof, it will be understood by those skilled in the art that various changes in form and detail may be made therein without departing from the spirit and scope of the invention.

What is claimed is:
1. A circuit comprising:
a clock signal input node;
a data input node;
an intermediate node;
an output node;
first and second transistor input means connected in electrical parallel between said data input node and said intermediate node;
third transistor input means connected between said clock signal input node and said intermediate node;
fourth transistor input means connected between said clock signal input node and said first transistor input means, said fourth transistor input means having emitter, base, and collector regions, the emitter being connected to said clock signal input node, the collector being connected to said first transistor input means, said base being electrically coupled to a first source of fixed potential;

transistor output means connected between said intermediate node and said output node; and an electrical signal feedback path connecting said output node to said second and third transistor input means.

2. A circuit as in claim 1 wherein said second and third transistor input means comprises:

a multi-emitter transistor having at least one collector region, at least one base region, and at least one collector regions, the collector region of said multi-emitter transistor being electrically connected to said intermediate node, the base region of said multi-emitter transistor being electrically connected to said feedback path, a first one of said at least two emitter regions being connected to said data input node, a second one of said at least two emitter regions being connected to said clock signal input node.

3. A circuit as in claim 2 further comprising:

a fifth transistor in the electrical signal feedback path connecting said output node to said second and third transistor input means.

4. A circuit as in claim 3 wherein said fifth transistor comprises emitter, base, and collector regions, its emitter region being connected to said output node, its collector region being connected to said multi-emitter transistor, its base region being connected to said first fixed potential.

5. A circuit as in claim 2 further comprising:

a fifth transistor input means having emitter, base, and collector regions, the collector and base regions being in common with the base and collector regions of said multi-emitter transistor, said fifth transistor having an emitter connected to a second data input node.

6. A circuit as in claim 2 further comprising:

fifth, sixth, and seventh transistor input means having collector, base, and emitter regions, said fifth and sixth transistor input means having base and collector regions in common with said first transistor input means, said seventh transistor input means having base and collector regions in common with said multi-emitter transistor.

7. A circuit as in claim 1, further comprising a second source of fixed potential connected to said transistor output means, each said first, second, third, and fourth transistor input means having emitter, base and collector regions, said first source of fixed potential being resistively coupled to both the collector and the base of each said first, second, third, and fourth transistor input means.

8. A latch circuit comprising:

a first source of fixed potential;
a second source of fixed potential;
a clock signal input node;
a data input node;
an intermediate node;
an output node;
first and second transistor input means each having emitter, base and collector regions, and connected in electrical parallel between said data input node and said intermediate node;
third transistor input means having emitter, base and collector regions, and connected between said clock signal input node and said intermediate node;
fourth transistor input means having emitter, base and collector regions, and connected between said clock signal input node and said first transistor input means;
transistor output means having emitter, base and collector regions, and connected between said intermediate node and said output node;
said first source of fixed potential being resistively coupled to the collector regions of said first, second, third, and fourth transistor input means and the collector region of said transistor output means, said first source of fixed potential also being resistively coupled to the base regions of said first and fourth transistor input means;
said second source of fixed potential being coupled to the emitter region of said transistor output means; and
an electrical signal feedback path connecting said output node to said second and third transistor input means;
whereby data in the form of a binary signal having either an up or down potential level occurring at said data input node during the presence of a signal on said clock signal input node, is inverted and provided at said output node and latched at a constant binary signal level until a subsequent occurrence of a signal on said clock signal input node.

9. A latch circuit as in claim 8 wherein said second and third transistor input means comprises:

a multi-emitter transistor having at least one collector region, at least one base region, and at least two emitter regions, the collector region of said multi-emitter transistor being electrically connected to said intermediate node, the base region of said multi-emitter transistor being electrically connected to said feedback path, a first one of said at least two emitter regions being connected to said data input node, a second one of said at least two emitter regions being connected to said clock signal input node.

10. A latch circuit as in claim 9 further comprising:

a fifth transistor in the electrical signal feedback path connecting said output node to said second and third transistor input means.

11. A latch circuit as in claim 10 wherein said fifth transistor comprises emitter, base, and collector regions, its emitter region being connected to said output node, its collector region being connected to said multi-emitter transistor, its base region being connected to said first fixed potential.

12. A circuit as in claim 9 further comprising:

a fifth transistor input means having emitter, base, and collector regions, the collector and base regions being in common with the base and collector regions of said multi-emitter transistor, said fifth transistor having an emitter connected to a second data input node.

13. A circuit as in claim 9 further comprising:

fifth, sixth, and seventh transistor input means having collector, base, and emitter regions, said fifth and sixth transistor input means having base and collector regions in common with said first transistor input means, said seventh transistor input means having base and collector regions in common with said multi-emitter transistor.

* * * * *

UNITED STATES PATENT AND TRADEMARK OFFICE
CERTIFICATE OF CORRECTION

PATENT NO. : 3,986,057
DATED : October 12, 1976
INVENTOR(S) : Edward B. Eichelberger et al It is certified that error appears in the above-identified patent and that said Letters Patent are hereby corrected as shown below:

| | |
|---|---|
| Column 7, Line 41 | delete "3,748,907" and insert therefor --3,784,907-- |
| Column 9, Line 9 | delete "one" (2nd occurrence) and insert therefor --two-- |
| Column 9, Line 10 | delete "collector" and insert therefor --emitter-- |

Signed and Sealed this

Nineteenth Day of September 1978

[SEAL]

Attest:

RUTH C. MASON
*Attesting Officer*

DONALD W. BANNER
*Commissioner of Patents and Trademarks*